(12) United States Patent
Kim

(10) Patent No.: US 9,374,088 B2
(45) Date of Patent: Jun. 21, 2016

(54) IMPEDANCE CALIBRATION APPARATUS OF SEMICONDUCTOR INTEGRATED CIRCUIT

(75) Inventor: Chul Kim, Ichon-shi (KR)

(73) Assignee: SK HYNIX INC., Icheon-Si (KR)

(*) Notice: Subject to any disclaimer, the term of this patent is extended or adjusted under 35 U.S.C. 154(b) by 1506 days.

(21) Appl. No.: 12/970,921

(22) Filed: Dec. 16, 2010

(65) Prior Publication Data

US 2011/0241653 A1 Oct. 6, 2011

(30) Foreign Application Priority Data

Mar. 31, 2010 (KR) .................... 10-2010-0029337

(51) Int. Cl.
G01R 25/00 (2006.01)
H03K 19/00 (2006.01)

(52) U.S. Cl.
CPC .................... *H03K 19/0005* (2013.01)

(58) Field of Classification Search
CPC . H03K 19/0005; H04L 25/0278; H04L 25/12
USPC .................... 324/76.83; 326/30, 87
See application file for complete search history.

(56) References Cited

U.S. PATENT DOCUMENTS

| 5,744,985 | A   | * | 4/1998  | Nishida        | 327/94       |
|-----------|-----|---|---------|----------------|--------------|
| 6,115,298 | A   |   | 9/2000  | Kwon et al.    |              |
| 6,636,821 | B2  | * | 10/2003 | Lawson         | H03K 19/0005 |
|           |     |   |         |                | 326/30       |
| 7,019,556 | B2  | * | 3/2006  | Yoo            | G11C 7/1051  |
|           |     |   |         |                | 326/26       |
| 7,443,193 | B1  | * | 10/2008 | Santurkar et al.| 326/30      |
| 7,479,800 | B1  | * | 1/2009  | Vullaganti     | H03K 19/0005 |
|           |     |   |         |                | 326/21       |
| 7,495,469 | B2  | * | 2/2009  | Park           | 326/30       |
| 7,528,626 | B2  | * | 5/2009  | Kim            | H03K 19/0005 |
|           |     |   |         |                | 326/30       |
| 7,782,078 | B2  | * | 8/2010  | Koo            | G11C 5/063   |
|           |     |   |         |                | 326/30       |
| 9,018,974 | B2  | * | 4/2015  | Chang          | H03K 19/0005 |
|           |     |   |         |                | 326/26       |
| 2005/0276126 | A1 |  | 12/2005 | Choi et al.   |              |
| 2006/0261844 | A1 |  | 11/2006 | Kim et al.    |              |
| 2008/0001623 | A1 | * | 1/2008 | Kim           | 326/30       |
| 2008/0001624 | A1 | * | 1/2008 | Lee           | 326/30       |
| 2008/0259697 | A1 |  | 10/2008 | Abe          |              |
| 2008/0284467 | A1 | * | 11/2008 | Koo           | G11C 5/063   |
|           |     |   |         |                | 326/30       |
| 2009/0261856 | A1 | * | 10/2009 | Kwean         | 326/30       |
| 2011/0037496 | A1 | * | 2/2011  | Ibaraki et al.| 326/30       |

FOREIGN PATENT DOCUMENTS

| JP | 2006-345494 | 12/2006 |
| JP | 2007-110615 | 4/2007 |
| KR | 100937951 B1 | 1/2010 |
| KR | 1020100131746 A | 12/2010 |

* cited by examiner

*Primary Examiner* — Alexander H Taningco
*Assistant Examiner* — Nelson Correa
(74) *Attorney, Agent, or Firm* — William Park & Associates Ltd.

(57) ABSTRACT

An impedance calibration apparatus of a semiconductor integrated circuit includes: a D/A conversion unit configured to receive a code and generate an analog voltage depending on the code; a virtual code voltage generation unit configured to detect a level of the analog voltage and generate a plurality of virtual code voltages based on the level of the analog voltage; a comparison unit configured to receive the plurality of virtual code voltages and a reference voltage as inputs, and compare the plurality of virtual code voltages with the reference voltage to generate a plurality of comparison signals; and a code generation unit configured to receive the plurality of comparison signals and generate the code using the plurality of comparison signals.

14 Claims, 5 Drawing Sheets

US 9,374,088 B2

IMPEDANCE CALIBRATION APPARATUS OF SEMICONDUCTOR INTEGRATED CIRCUIT

CROSS-REFERENCES TO RELATED APPLICATION

The present application claims priority under 35 U.S.C. §119(a) to Korean Application No. 10-2010-0029337, filed on Mar. 31, 2010, in the Korean Intellectual Property Office, which is incorporated herein by reference in its entirety as if set forth in full.

BACKGROUND

1. Technical Field

The present invention relates to a semiconductor integrated circuit, and more particularly, to an impedance calibration apparatus of a semiconductor integrated circuit.

2. Related Art

One way of enhancing the stability of output data from a semiconductor integrated circuit is to configure the data output driver of the semiconductor integrated circuit to maintain a constant impedance value, for example, 240 Ohm.

The data output driver is designed to have a desired impedance value depending on codes.

Therefore, an impedance calibration circuit is provided to perform a code control operation that substantially equalizes the impedance of a D/A conversion circuit, configured by duplicating the data output driver, to 240 Ohm.

FIG. 1 is a block diagram of an impedance calibration apparatus of a conventional semiconductor integrated circuit. Referring to FIG. 1, an impedance calibration apparatus 1 of a conventional semiconductor integrated circuit includes a plurality of voltage dividers 10 and 20 each of which comprising a plurality of resistors, a plurality of comparators 30 to 50, a plurality of counters 60 and 70, and a plurality of D/A converters 80 and 90.

In the impedance calibration apparatus 1, the plurality of D/A converters 80 and 90 receive commands CM1 and CM2 as inputs which enable the D/A converters 80 and 90.

Thereafter, a first code PCODE<0:N> is counted to change the code value thereof.

Furthermore, the impedance calibration apparatus 1 repeats the operation of changing the first code PCODE<0: N> until the level of a code voltage VP generated by converting the first code PCODE<0:N> is between the levels of a first reference voltage VREF1 and a second reference voltage VREF2, and completes the impedance calibration for the first code PCODE<0:N>.

The calibrated first code PCODE<0:N> is then applied to the D/A converter 90, and impedance calibration for a second code NCODE<0:N> is performed in the above-described manner.

The above-described technology requires a time corresponding to a maximum of 512 clocks which is required to perform the process of sequentially increasing the first code PCODE<0:N> and the second code NCODE<0:N>. Accordingly, the areas of the counters 60 and 70 are increased.

Furthermore, since high voltages VDDQ-VSSQ are applied to the plurality of voltage dividers 10 and 20 for generating the first reference voltage VREF1 and the second reference voltage VREF2, a large number of resistors are required. This also serves as a factor which increases the area.

SUMMARY

An impedance calibration apparatus of a semiconductor integrated circuit, which may reduce impedance calibration time and circuit area, is described herein.

In one exemplary aspect of the disclosure, an impedance calibration apparatus of a semiconductor integrated circuit includes: a D/A conversion unit configured to receive a code and generate an analog voltage depending on the code; a virtual code voltage generation unit configured to detect a level of the analog voltage and generate a plurality of virtual code voltages based on the level of the analog voltage; a comparison unit configured to receive the plurality of virtual code voltages and a reference voltage as inputs, and compare the plurality of virtual code voltages with the reference voltage to generate a plurality of comparison signals; and a code generation unit configured to receive the plurality of comparison signals and generate the code using the plurality of comparison signals.

In another exemplary aspect of the disclosure, an impedance calibration apparatus of a semiconductor integrated circuit includes: a first D/A conversion unit configured to receive a first code and generate a first analog voltage in response to the first code; a second D/A conversion unit configured to receive a second code and generate a second analog voltage in response to the second code; a virtual code voltage generation unit configured to detect a level of one of the first and second analog voltages and generate a plurality of virtual code voltages; a comparison unit configured to receive the plurality of virtual code voltages and a reference voltage as inputs, and compare the plurality of virtual code voltages with the reference voltage to generate a plurality of comparison signals; a first code generation unit configured to generate the first code using the plurality of comparison signals; and a second code generation unit configured to generate the second code using the plurality of comparison signals.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
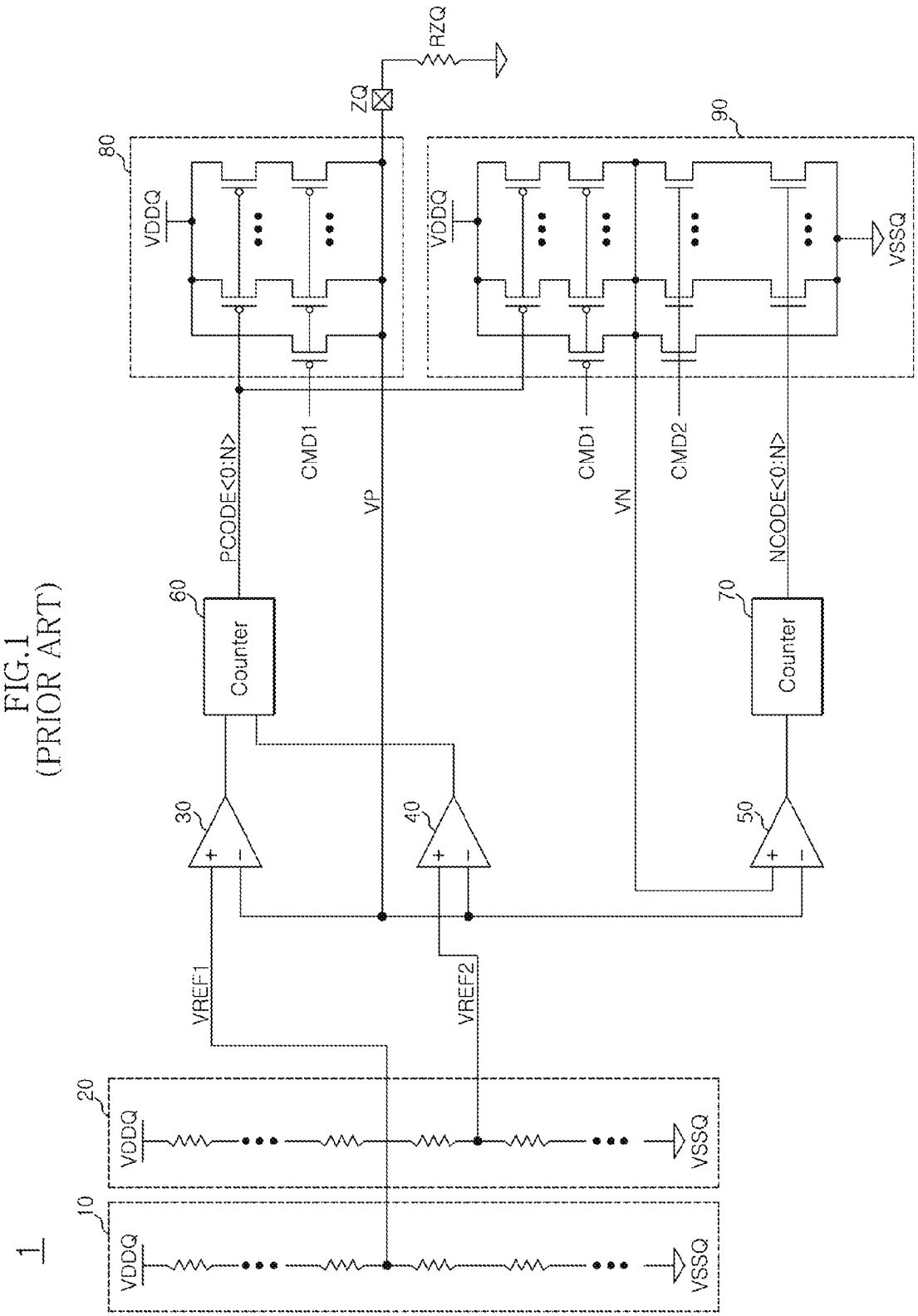
FIG. 1 is a block diagram of an impedance calibration apparatus of a conventional semiconductor integrated circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
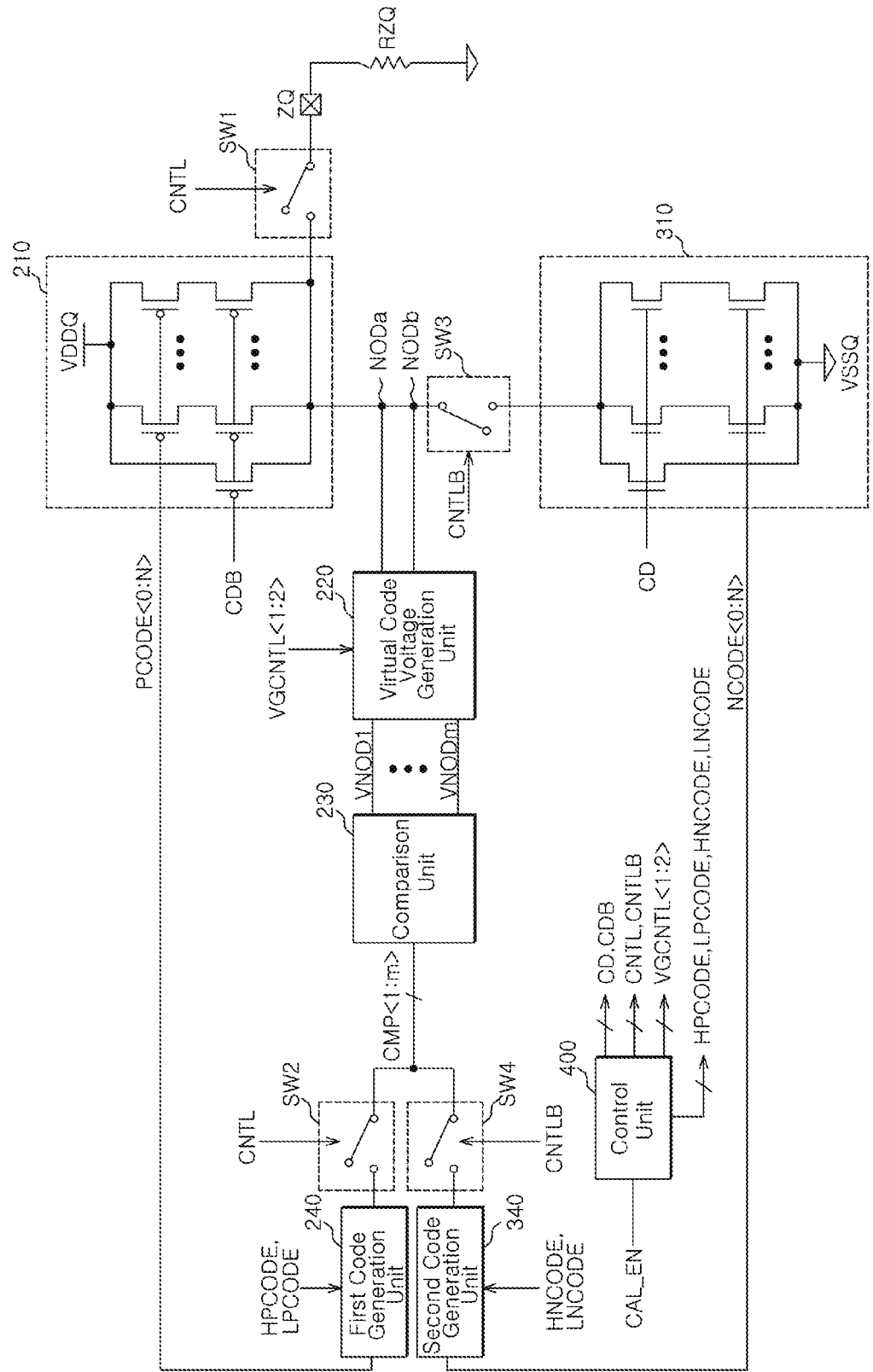
FIG. 2 is a block diagram of an impedance calibration apparatus of a semiconductor integrated circuit according to one embodiment of the disclosure.

FIG. 2 is a block diagram of an impedance calibration apparatus of a semiconductor integrated circuit according to one embodiment of the disclosure. Referring to FIG. 2, an impedance calibration apparatus of a semiconductor integrated circuit according to the embodiment of the disclosure includes a first D/A conversion unit 210, a virtual code voltage generation unit 220, a comparison unit 230, a first code generation unit 240, a second D/A conversion unit 310, a second code generation unit 340, a control unit 400, and first to fourth switches SW1 to SW4.

The first D/A conversion unit 210 is configured to be enabled in response to an enable signal CDB and to convert a digital first code PCODE<0:N> into an analog voltage.

The first D/A conversion unit 210 is coupled to an external resistor pad ZQ through a first switch SW1. The external resistor pad ZQ is coupled to an external resistor RZQ of the semiconductor integrated circuit.

The second D/A conversion unit 310 is configured to be enabled in response to an enable signal CD, and to convert a digital second code NCODE<0:N> to an analog voltage.

The first D/A conversion unit 210 and the second D/A conversion unit 310 are circuits designed to implement substantially the same impedance as a data output driver. Each of the first and second D/A conversion units 210 and 310 includes a plurality of PMOS transistors and a plurality of NMOS transistors.

The first and second D/A conversion units 210 and 310 are coupled through a third switch SW3.

The virtual code voltage generation unit 220 is coupled to first and second nodes NODa and NODb between the first and second D/A conversion units 210 and 310.

The virtual code voltage generation unit 220 is configured to generate a plurality of virtual code voltages VNOD<1:m> using the analog voltage outputted from the first D/A conversion unit 210 or the second D/A conversion unit 310, in response to voltage generation control signals VGCNTL<1:2>.

At this time, the plurality of virtual code voltages VNOD<1:m> have substantially the same level as the analog voltage which may be generated by the first D/A conversion unit 210 or the second D/A conversion unit 310 depending on the change in the first code PCODE<0:N> or the second code NCODE<0:N>. That is, the plurality of virtual code voltages VNOD<1:m> have substantially the same level as the analog voltage generated by the first D/A conversion unit 210 or the second D/A conversion unit 310 as the code value of the first code PCODE<0:N> or the second code NCODE<0:N> is sequentially changed from a minimum to a maximum value.

The comparison unit 230 is configured to compare the plurality of virtual code voltages VNOD<1:m> with a reference voltage VREF and to generate a plurality of comparison signals CMP<1:m>.

At this time, the reference voltage VREF may correspond to VDDQ/2.

The first code generation unit 240 is configured to generate and to latch the first code PCODE<0:N> using the plurality of comparison signals CMP<1:m>.

The first code generation unit 240 is configured to output the first code PCODE<0:N> having a maximum or minimum code value in response to code control signals HPCODE and LPCODE.

All the PMOS transistors of the first D/A conversion unit 210 are turned on when the first code PCODE<0:N> has a maximum code value, and thus the analog voltage is outputted at its highest level from the first D/A conversion unit 210.

Meanwhile, only one PMOS transistor receiving the enable signal CDB is turned on when the first code PCODE<0:N> has a minimum code value, and thus the analog voltage is outputted at its lowest level from the first D/A conversion unit 210.

The second code generation unit 340 is configured to generate and to latch the second code NCODE<0:N> using the plurality of comparison signals CMP<1:m>.

The second code generation unit 340 is configured to output the second code NCODE<0:N> having a maximum code value or minimum code value in response to code control signals HNCODE and LNCODE.

All the NMOS transistors of the second D/A conversion unit 310 are turned on when the second code NCODE<0:N> has a maximum code value, and thus analog voltage is outputted at its highest level from the second D/A conversion unit 310.

Meanwhile, only one NMOS transistor receiving the enable signal CD is turned on when the second code NCODE<0:N> has a minimum code value, and thus the analog voltage is outputted at its lowest level from the second D/A conversion unit 310.

The first switch SW1 is configured to couple the first D/A conversion unit 210 to the external resistor pad ZQ in response to a switching control signal CNTL.

The second switch SW2 is configured to couple the comparison unit 230 to the first code generation unit 240 in response to the switching control signal CNTL.

The third switch SW3 is configured to couple the first D/A conversion unit 210 to the second D/A conversion unit 310 in response to a switching control signal CNTLB.

The fourth switch SW4 is configured to couple the comparison unit 230 to the second code generation unit 340 in response to the switching control signal CNTLB.

At this time, the switching control signal CNTLB has the opposite phase to the switching control signal CNTL.

The control unit 400 is configured to generate the enable signals CD and CDB, the switching control signals CNTL and CNTLB, the plurality of code control signals HPCODE, LPCODE, HNCODE, LNCODE, and the voltage generation control signals VGCNTL<1:2> based on the respective timings, in response to an external command, for example, an impedance calibration command CAL_EN.

Figure 3:
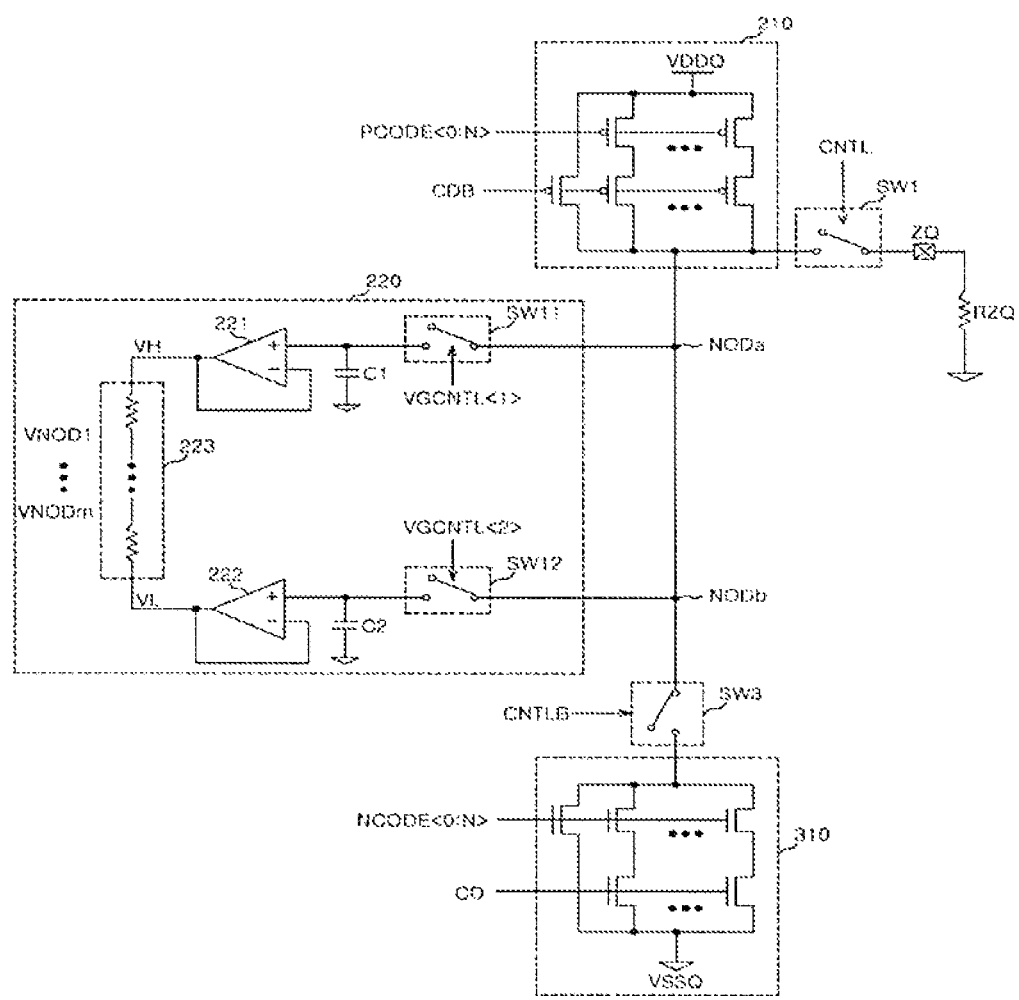
FIG. 3 is a circuit diagram illustrating the internal configuration of a virtual code voltage generation unit of FIG. 2.

FIG. 3 is a circuit diagram illustrating the internal configuration of a virtual code voltage generation unit of FIG. 2. Referring to FIG. 3, the virtual code voltage generation unit 220 includes a plurality of switches SW11 and SW12, a plurality of capacitors C1 and C2, a plurality of amplifiers 221 and 222, and a division resistor array 223.

The switch SW11 has one end coupled to the first node NODa and the other end coupled to the amplifier 221, and is configured to couple the first node NODa to the amplifier 221 in response to the voltage generation control signal VGCNTL<1>.

The switch SW12 has one end coupled to the second node NODb and the other end coupled to the amplifier 222, and is configured to couple the second node NODb to the amplifier 222 in response to the voltage generation control signal VGCNTL<2>.

The plurality of capacitors C1 and C2 are coupled between non-inverting terminals (+) of the amplifiers 221 and 222 and ground terminals respectively.

The plurality of capacitors C1 and C2 are configured to store the analog voltages outputted from the first D/A conversion unit 210 and the analog voltage outputted from the second D/A conversion unit 310 respectively.

The plurality of amplifiers 221 and 222 are configured to maintain a voltage VH-VL across the division resistor array 223 to substantially the same voltage as the voltages stored in the plurality of capacitors C1 and C2, through a push/pull operation.

At this time, when the first code PCODE<0:N> or the second code NCODE<0:N> has a maximum code value, an analog voltage is outputted at its highest level from the first D/A conversion unit 210 or the second D/A conversion unit 310. Therefore, the voltage VH of the division resistor array 223 may become substantially the same level as the highest-level analog voltage outputted from the first D/A conversion unit 210 or the second D/A conversion unit 310.

Meanwhile, when the first code PCODE<0:N> or the second code NCODE<0:N> has a minimum code value, an analog voltage is outputted at its lowest level from the first D/A conversion unit 210 or the second D/A conversion unit 310. Therefore, the voltage VL of the division resistor array 223 may become substantially the same level as the lowest-level analog voltage outputted from the first D/A conversion unit 210 or the second D/A conversion unit 310.

The division resistor array 223 is configured to divide the voltage VH-VL into a plurality of virtual code voltages VNOD<1:m> through a plurality of resistors.

The division resistor array 223 may be designed in such a manner that the amount in change of the analog voltage outputted based on the resolution of the first code PCODE<0:N> or the second code NCODE<0:N>, that is, the code value change, is equal to the level difference among the virtual code voltages VNOD<1:m>.

Figure 4:
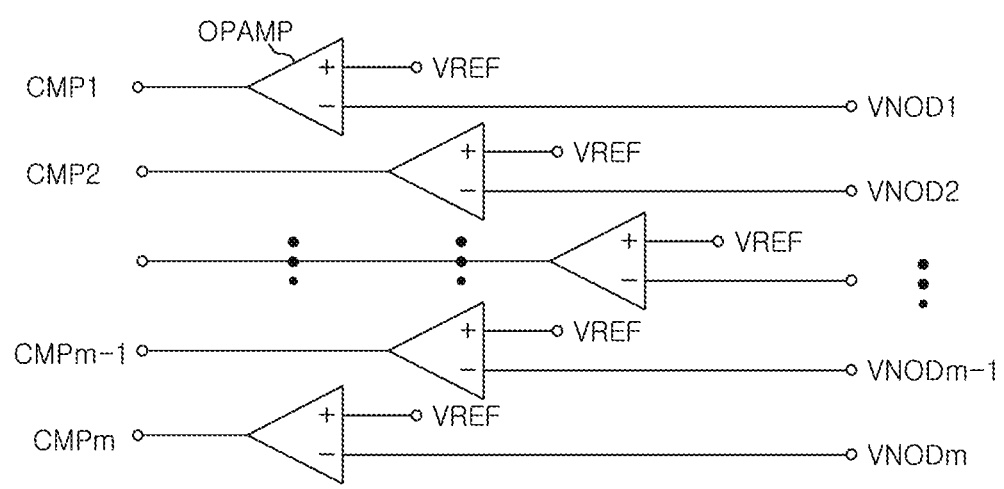
FIG. 4 is a circuit diagram of a comparison unit of FIG. 2.

FIG. 4 is a circuit diagram of the comparison unit shown in FIG. 2. Referring to FIG. 4, the comparison unit 230 is configured to compare the plurality of virtual code voltages VNOD<1:m> with the reference voltage VREF using a plurality of amplifiers OPAMP, and to generate the comparison signals CMP<1:m>.

Hereafter, the operation of the impedance calibration apparatus 100 of the semiconductor integrated circuit according to the embodiment will be described as follows.

Figure 5:
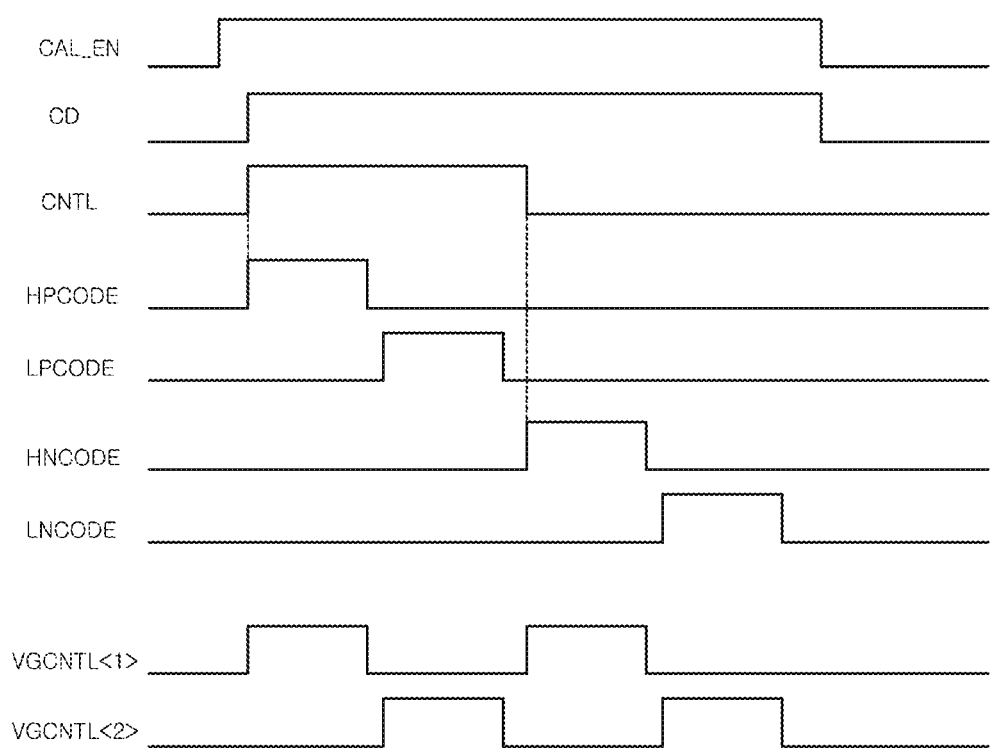
FIG. 5 is an output waveform diagram of a control unit of FIG. 2.

First, when the impedance calibration command CAL_EN is inputted, the control unit 400 generates the enable signals CD and CDB, the switching control signals CNTL and CNTLB, the plurality of code control signals HPCODE, LPCODE, HNCODE, LNCODE, and the voltage generation control signals VGCNTL<1:2> based on timings as shown in FIG. 5.

As the enable signals CD and CDB are activated, the first D/A conversion unit 210 and the second D/A conversion unit 310 are enabled.

As the switching control signal CNTL is activated, the first D/A conversion unit 210 is coupled to the external resistor pad ZQ, and the comparison unit 230 is coupled to the first code generation unit 240.

As the code control signals HPCODE and LPCODE are sequentially activated, the first code generation unit 240 outputs a first code PCODE<0:N> having a maximum value and a first code PCODE<0:N> having a minimum value.

The first D/A conversion unit 210 generates a highest-level analog voltage and a lowest-level analog voltage in response to the first code PCODE<0:N> having a maximum value and the first code PCODE<0:N> having a minimum value.

FIG. 5 is an output waveform diagram of a control unit of FIG. 2. Referring to FIG. 5, as the plurality of switches SW11 and SW12 of FIG. 3 are repetitively turned on/off based on the voltage generation control signals VGCNTL<1:2>, the capacitors C1 and C2 store the highest-level analog voltage and the lowest-level analog voltage respectively, which are outputted from the first D/A conversion unit 210.

The level of the voltage across the division resistor array 223 is maintained to the voltage level VH-VL which is substantially the same as those of the voltages stored in the capacitors C1 and C2 by the push/pull amplifiers 221 and 222.

Furthermore, the virtual code voltages VNOD<1:m> are generated by the division resistors of the division resistor array 223.

Therefore, the virtual code voltages VNOD<1:m> have all levels of analog voltage which the first D/A conversion unit 210 is capable of outputting depending on the change in the code value of the first code PCODE<0:N>.

The comparison unit 230 compares the virtual code voltages VNOD<1:m> with the reference voltage VREF and generates the comparison signals CMP<1:m>.

Eventually, the first D/A conversion unit 210 has the same resistance value as the external resistor RQZ through impedance calibration, that is, the calibration of the first code PCODE<0:N>.

When the first D/A conversion unit 210 has the same resistance value as the external resistor RQZ, the outputted analog voltage becomes substantially the same as VDDQ/2, that is, the reference voltage VREF. The code value at this time is referred to as a target code value.

Therefore, the comparison signals CMP<1:m> include information on the target code value at which the first D/A conversion unit 210 has the same resistance value as the external resistor RQZ.

Accordingly, the first code generation unit 240 encodes the comparison signals CMP<1:m>, generates and latches the first code PCODE<0:N> having the target code value.

Thereafter, when the switching control signal CNTLB is activated, the first D/A conversion unit 210 is coupled to the second D/A conversion unit 310, and the comparison unit 230 is coupled to the second code generation unit 340.

Meanwhile, the first D/A conversion unit 210 and the external resistor pad ZQ are electrically separated from each other since the switching control signal CNTL is deactivated, and the first code generation unit 240 and the comparison unit 230 are electrically separated from each other.

As the code control signals HNCODE and LNCODE are sequentially activated, the second code generation unit 340 outputs a second code NCODE<0:N> having a maximum value and a second code NCODE<0:N> having a minimum value.

The second D/A conversion unit 310 generates a highest-level analog voltage and a lowest-level analog voltage in response to the second code NCODE<0:N> having a maximum value and the second code NOCDE<0:N> having a minimum value.

Subsequently, the comparison signals CMP<1:m> are generated through the same process as the calibration of the first code PCODE<1:N>.

At this time, the second D/A conversion unit 310 has the same resistance value as the first D/A conversion unit 210 through the calibration of the second code NCODE<0:N>.

When the second D/A conversion unit 310 has the same resistance value as the first D/A conversion unit 210, the outputted analog voltage becomes substantially the same as VDDQ/2, that is, the reference voltage VREF. The code value at this time is referred to as a target code value.

Therefore, the comparison signals CMP<1:m> includes information on the target code value at which the second D/A conversion unit 310 has the same resistance value as the first D/A conversion unit 210.

Accordingly, the second code generation unit 340 encodes the comparison signals CMP<1:m>, generates and latches the second code NCODE<0:N> having the target code value.

According to the embodiment of the disclosure, since impedance calibration is performed through a parallel comparison method using the virtual code voltages, it is possible to reduce impedance calibration time and circuit area.

While certain embodiments have been described above, it will be understood to those skilled in the art that the embodiments described are by way of example only. Accordingly, the impedance calibration apparatus described herein should not be limited based on the described embodiments. Rather, the impedance calibration apparatus described herein should only be limited in light of the claims that follow when taken in conjunction with the above description and accompanying drawings.

What is claimed is:

1. An impedance calibration apparatus of a semiconductor integrated circuit, comprising:
a D/A conversion unit configured to drive an analog voltage according to the code;
a virtual code voltage generation unit configured to generate a plurality of virtual code voltages in response to a level of the analog voltage;
a comparison unit configured to generate a plurality of comparison signals by comparing the plurality of virtual code voltages with a reference voltage; and
a code generation unit configured to receive the plurality of comparison signals and generate the code using the plurality of comparison signals,
wherein the virtual code voltage generation unit is configured to store the analog voltage and to divide the analog voltage to generate the plurality of virtual code voltages.

2. The impedance calibration apparatus according to claim 1, wherein a range of levels of the plurality of virtual code voltages corresponds to a range of levels of the analog voltage generated by the D/A conversion unit as a code value of the code is changed from a minimum value to a maximum value.

3. The impedance calibration apparatus according to claim 1, wherein the virtual code voltage generation unit comprises:
a first capacitor;
a first amplifier having a first input terminal coupled to the first capacitor and a second input terminal coupled to an output terminal thereof;
a second capacitor;
a second amplifier having a first input terminal coupled to the second capacitor and a second input terminal coupled to an output terminal thereof;
a division resistor array coupled between the output terminal of the first amplifier and the output terminal of the second amplifier;
a first switch configured to connect the first capacitor to the D/A conversion unit in response to an activation of a first control signal; and
a second switch configured to connect the second capacitor to the D/A conversion unit in response to an activation of a second control signal,
wherein the first control signal and the second control signal are activated alternately.

4. The impedance calibration apparatus according to claim 1, wherein the code generation unit is configured to generate the code by encoding the plurality of comparison signals.

5. The impedance calibration apparatus according to claim 1, wherein the code generation unit is configured to sequentially provide the code having a maximum code value and the code having a minimum value to the D/A conversion unit in response to a code control signal.

6. The impedance calibration apparatus according to claim 5, further comprising a control unit configured to generate the code control signal in response to an impedance calibration command.

7. An impedance calibration apparatus of a semiconductor integrated circuit, comprising:
a first D/A conversion unit configured to drive a first analog voltage in response to a first code;
a second D/A conversion unit configured to drive a second analog voltage in response to a second code;
a virtual code voltage generation unit configured to generate a plurality of virtual code voltages in response to a level of one of the first and second analog voltages;
a comparison unit configured to generate a plurality of comparison signals by comparing the plurality of virtual code voltages with a reference voltage;
a first code generation unit configured to generate the first code using the plurality of comparison signals; and
a second code generation unit configured to generate the second code using the plurality of comparison signals,
wherein the virtual code voltage generation unit is configured to store the analog voltage generated by one of the first and second D/A conversion units, and to divide the stored analog voltage to generate the plurality of virtual code voltages.

8. The impedance calibration apparatus according to claim 7, wherein a range of levels of the plurality of virtual code voltages corresponds to a range of levels of the analog voltage generated by one of the first and second D/A conversion units as the code value of one of the first and second codes is changed from a minimum value to a maximum value.

9. The impedance calibration apparatus according to claim 7, wherein the virtual code voltage generation unit comprises:
a first capacitor;
a first amplifier having a first input terminal coupled to the first capacitor and a second input terminal coupled to an output terminal thereof;
a second capacitor;
a second amplifier having a first input terminal coupled to the second capacitor and a second input terminal coupled to an output terminal thereof;
a division resistor array coupled between the output terminal of the first amplifier and the output terminal of the second amplifier;
a first switch configured to connect the first capacitor to the first and second D/A conversion units in response to an activation of a first control signal; and
a second switch configured to connect the second capacitor to the first and second D/A conversion units in response to an activation of a second control signal,
wherein the first control signal and the second control signal are activated alternately.

10. The impedance calibration apparatus according to claim 7, wherein the first code generation unit is configured to sequentially provide the first code having a maximum code value and the first code having a minimum code value to the first D/A conversion unit, in response to a first code control signal.

11. The impedance calibration apparatus according to claim 10, wherein the second code generation unit is configured to sequentially provide the second code having a maximum code value and the second code having a minimum code value to the second D/A conversion unit, in response to a second code control signal.

12. The impedance calibration apparatus according to claim 11, further comprising a control unit configured to generate the first code control signal and the second code control signal in response to an impedance calibration command.

13. The impedance calibration apparatus according to claim 7, further comprising:
a first switch coupled between the first D/A conversion unit and an external resistor;
a second switch coupled between the comparison unit and the first code generation unit;
a third switch coupled between the first D/A conversion unit and the second D/A conversion unit; and a fourth switch coupled between the comparison unit and the second code generation unit.

14. The impedance calibration apparatus according to claim 13, wherein the first D/A conversion unit and the external resistor are coupled and the comparison unit and the first code generation unit are coupled in response to an impedance calibration command, and the impedance calibration apparatus further comprising a control unit configured to control the first to fourth switches to electrically separate the first D/A conversion unit from the second D/A conversion unit and to electrically separate the comparison unit from the second code generation unit.

* * * * *